United States Patent
Ku et al.

(10) Patent No.: US 8,970,405 B2
(45) Date of Patent: Mar. 3, 2015

(54) METHOD AND APPARATUS FOR ENTROPY DECODING

(71) Applicant: Certicom Corp., Mississauga (CA)

(72) Inventors: Weicheng Joseph Ku, San Jose, CA (US); Paul Daniel Imthurn, San Jose, CA (US)

(73) Assignee: Certicom Corp., Mississauga (CA)

( * ) Notice: Subject to any disclaimer, the term of this patent is extended or adjusted under 35 U.S.C. 154(b) by 116 days.

(21) Appl. No.: 13/859,508

(22) Filed: Apr. 9, 2013

(65) Prior Publication Data

US 2013/0222160 A1    Aug. 29, 2013

Related U.S. Application Data

(63) Continuation of application No. 13/092,698, filed on Apr. 22, 2011, now Pat. No. 8,416,104.

(60) Provisional application No. 61/343,117, filed on Apr. 23, 2010.

(51) Int. Cl.

| | |
|---|---|
| *H04N 19/91* | (2014.01) |
| *H03M 7/40* | (2006.01) |
| *H04N 19/61* | (2014.01) |
| *H04N 19/436* | (2014.01) |

(52) U.S. Cl.
CPC ............ *H03M 7/40* (2013.01); *H04N 19/00781* (2013.01); *H04N 19/00521* (2013.01); *H04N 19/00951* (2013.01)
USPC ................................ 341/67; 341/65; 341/107

(58) Field of Classification Search
CPC .................. H04N 19/00951; H04N 19/00521; H04N 19/00781; H04N 19/00121
USPC .............................................. 341/65, 67, 107
See application file for complete search history.

(56) References Cited

U.S. PATENT DOCUMENTS

| 6,094,151 | A | 7/2000 | Schwartz et al. |
| 6,677,868 | B2 * | 1/2004 | Kerofsky et al. ............. 341/107 |

(Continued)

FOREIGN PATENT DOCUMENTS

WO    2008121663 A2    10/2008

OTHER PUBLICATIONS

Extended European Search report mailed Aug. 1, 2011; in corresponding European patent application No. 11163747.6.

Grzegorz Pastuszak; "A High-Performance Architecture of Double-Mode Binary Coder for H.264.AVC"; IEEE Transactions on Circuits and Systems for Video Technology; IEEE Service Center, Piscataway, NJ, US; Jul. 1, 2008; vol. 18, No. 7; pp. 949-960.

(Continued)

*Primary Examiner* — Khai M Nguyen
(74) *Attorney, Agent, or Firm* — Novak Druce Connolly Bove + Quigg LLP

(57) ABSTRACT

An entropy decoder and method for decoding code words with an indication of associated probability for each code word. The decoder can be operable to receive code words and the indication of associated probability. A branch node block can be in communication with a leaf node block. The branch node block comprising one or more branch node lookup tables and branch node control logic. The branch node control logic operable to process a code word in the input buffer using a selected table from the one or more branch node lookup tables to obtain leaf node information and a bit count of a code word size, the branch control logic further operable to refresh the input buffer to replace the bit count of the code word size and to make the leaf node information and the table selection available to the leaf node block.

14 Claims, 11 Drawing Sheets

(56) References Cited

U.S. PATENT DOCUMENTS

| | | |
|---|---|---|
| 7,928,868 B1 * | 4/2011 | Huang et al. .................. 341/107 |
| 8,243,816 B2 * | 8/2012 | Tung et al. ............... 375/240.23 |
| 8,416,104 B2 | 4/2013 | Ku et al. |
| 2008/0240233 A1 * | 10/2008 | Au et al. .................. 375/240.02 |
| 2009/0003447 A1 | 1/2009 | Christoffersen |
| 2009/0168868 A1 | 7/2009 | Jahanghir |
| 2009/0196355 A1 | 8/2009 | Kao et al. |

OTHER PUBLICATIONS

Examination Report mailed Nov. 13, 2014; in European patent application No. 11163749.2.

Peng, Zhang et al; "Variable-Bin-Rate CABAC Engine for H.264/AVC High Definition Real-Time Decoding", IEEE transactions on very large scale integration (VLSI) Systems, IEEE Service center, piscataway, NJ, USA, vol. 17, No. 3, Mar. 1, 2009, pp. 417-426, XP011249867, ISSN: 1063-8210, DOI: DOI:10.1109/TVLSI.2008.2005286.

* cited by examiner

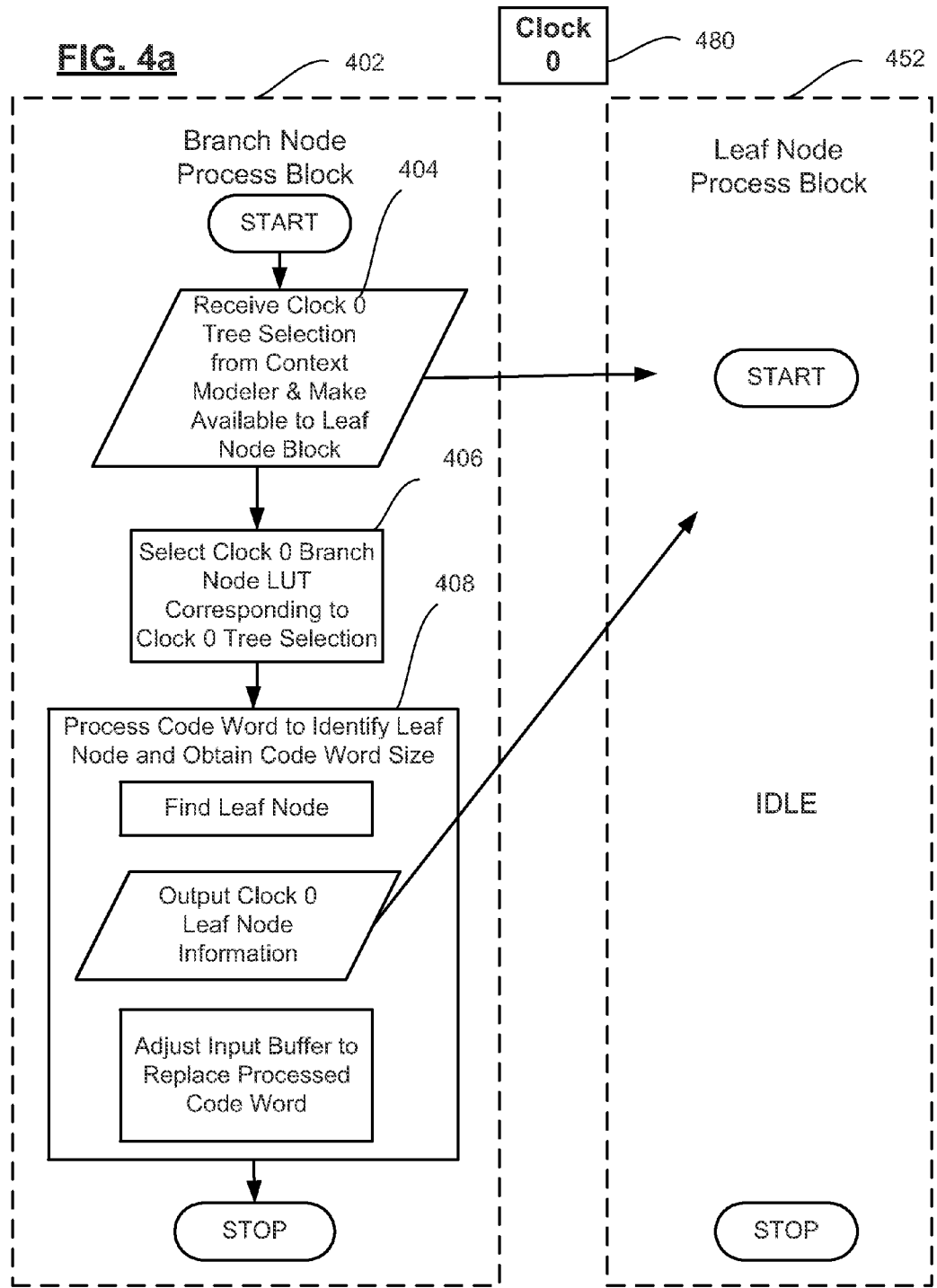

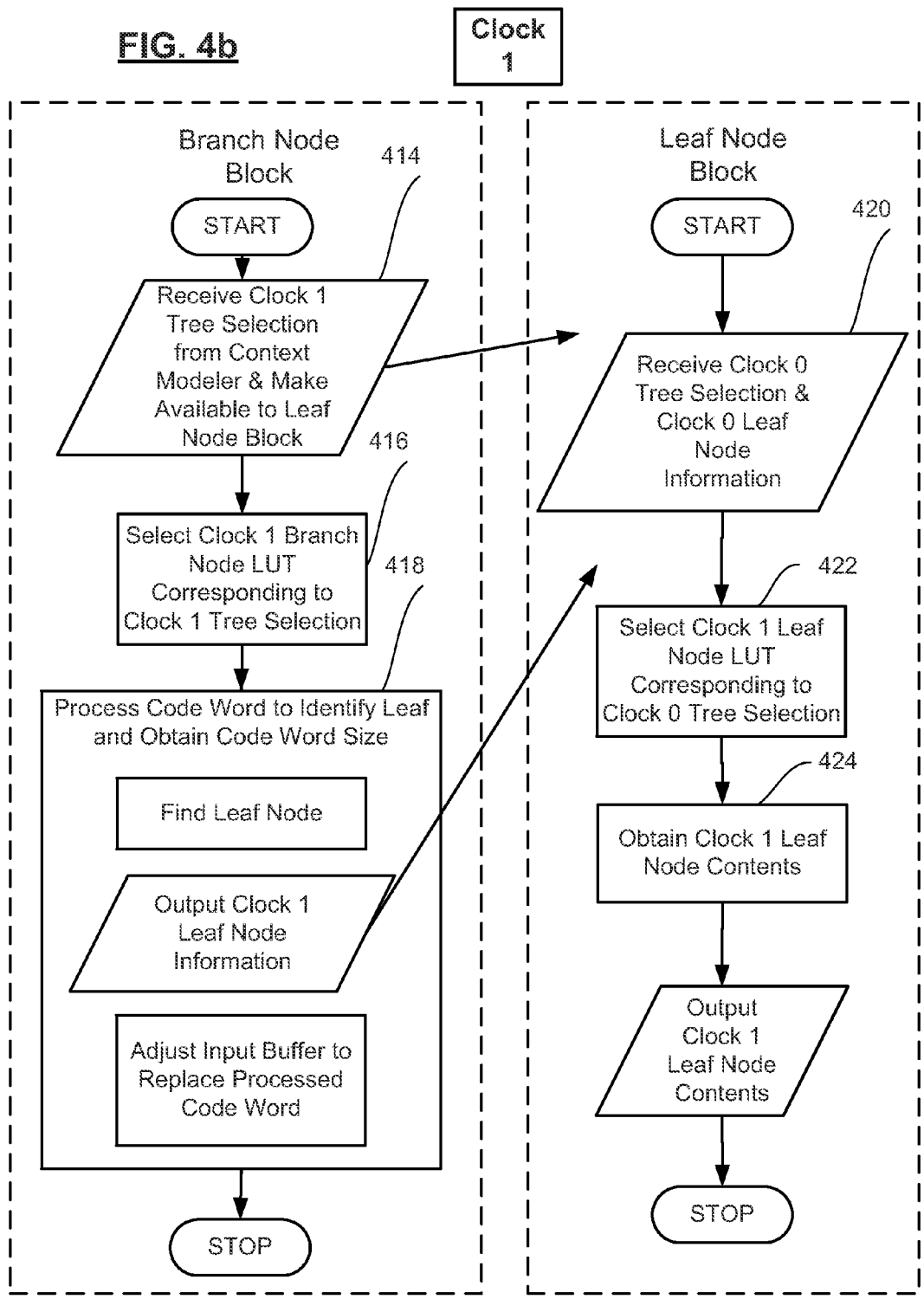

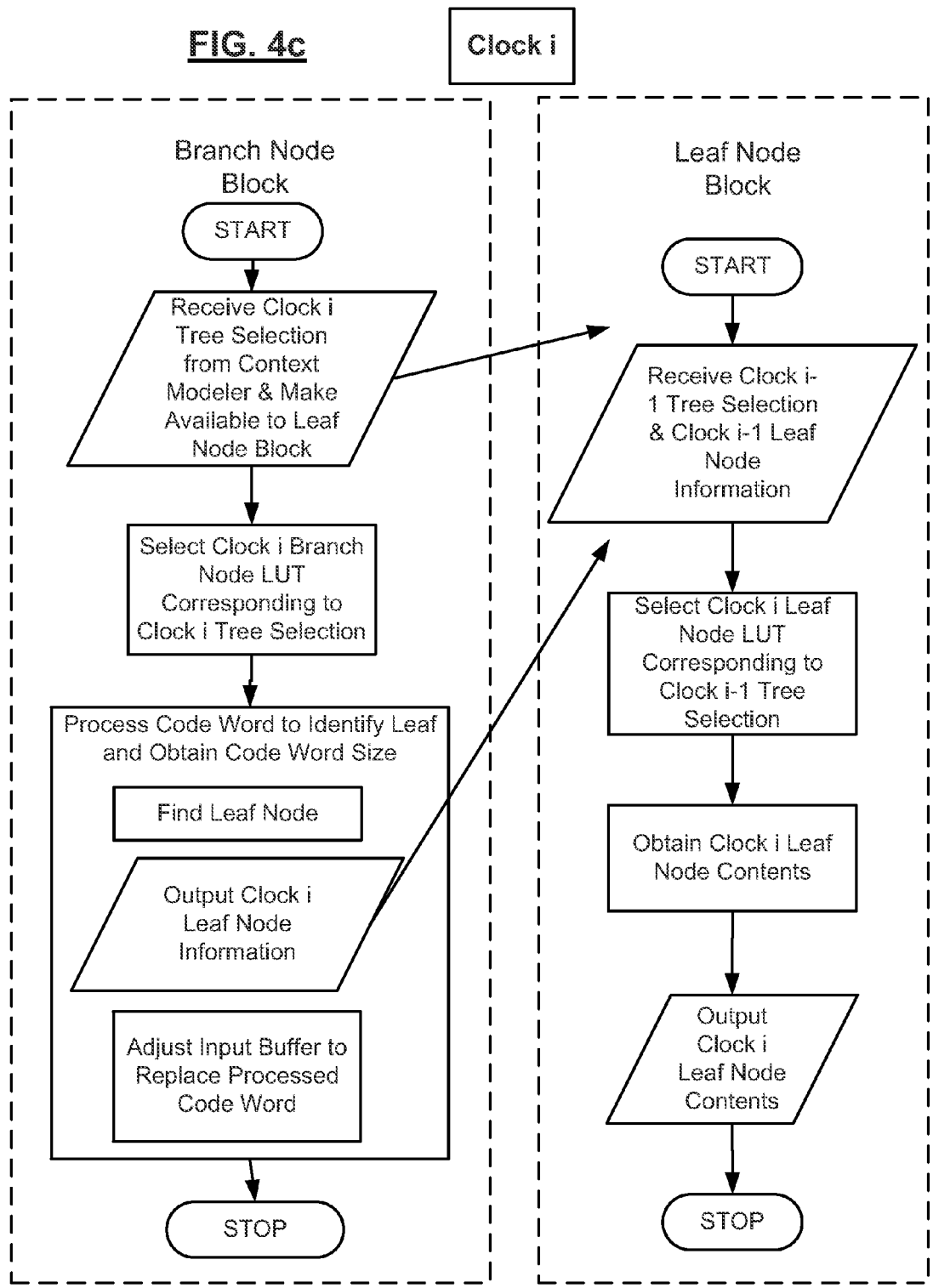

METHOD AND APPARATUS FOR ENTROPY DECODING

REFERENCE TO PRIOR APPLICATIONS

The present application is a continuation of U.S. patent application Ser. No. 13/092,698 filed on Apr. 22, 2011, now U.S. Pat. No. 8,416,104, which claims priority from U.S. Provisional Patent Application No. 61/343,117 filed Apr. 23, 2010, the entire contents of the applications are hereby incorporated by reference herein for all purposes.

FIELD

The present application generally relates to data compression and, in particular, to a method and apparatus for entropy decoding.

BACKGROUND

Data compression, whether lossy or lossless, often uses entropy coding to encode a decorrelated signal as a sequence of bits, i.e. a bitstream. Efficient data compression has a wide range of applications, such as data, image, audio, and video encoding. By way of example, ITU-T H.264/MPEG AVC is a video coding standard widely used for encoding/decoding video. It defines a number of different profiles for different applications, including the Main profile, Baseline profile and others.

There are a number of standards for encoding/decoding images and videos, including H.264, that employ lossy compression processes to produce binary data. For example, H.264 includes a prediction operation to obtain residual data, followed by a DCT transform and quantization of the DCT coefficients. The resulting data, including quantized coefficients, motion vectors, coding mode, and other related data, is then entropy coded to generate a bitstream of data for transmission or storage on a computer-readable medium.

A number of coding schemes have been developed to encode binary data. For example, JPEG images may be encoded using Huffman codes. The H.264 standard allows for two possible entropy coding processes: Context Adaptive Variable Length Coding (CAVLC) or Context Adaptive Binary Arithmetic Coding (CABAC). CABAC results in greater compression than CAVLC, but CABAC is more computationally demanding.

An entropy encoder/decoder is a component within a compression encoder/decoder. While the entropy encoder/decoder component is only a small portion of the overall compression encoder/decoder, it can present a significant bottleneck in real-time compression because of the serial nature of its operation.

It would be advantageous to provide for an improved implementation of an entropy decoder.

BRIEF DESCRIPTION OF THE DRAWINGS

Reference will now be made, by way of example, to the accompanying drawings which show example embodiments of the present application, and in which:

FIG. 2b shows, in block diagram form, an alternate embodiment of a portion of the entropy decoder of FIG. 2a;

FIG. 4a shows an initial clock cycle of a process flowchart of a hardware method embodiment for executing the algorithm of FIG. 3;

FIG. 4b shows a subsequent clock cycle of a process flowchart of a hardware method embodiment for executing the algorithm of FIG. 3;

FIG. 4c shows an ith clock cycle of a process flowchart of a hardware method embodiment for executing the algorithm of FIG. 3

Similar reference numerals may have been used in different figures to denote similar components.

DESCRIPTION OF EXAMPLE EMBODIMENTS

Figure 1:
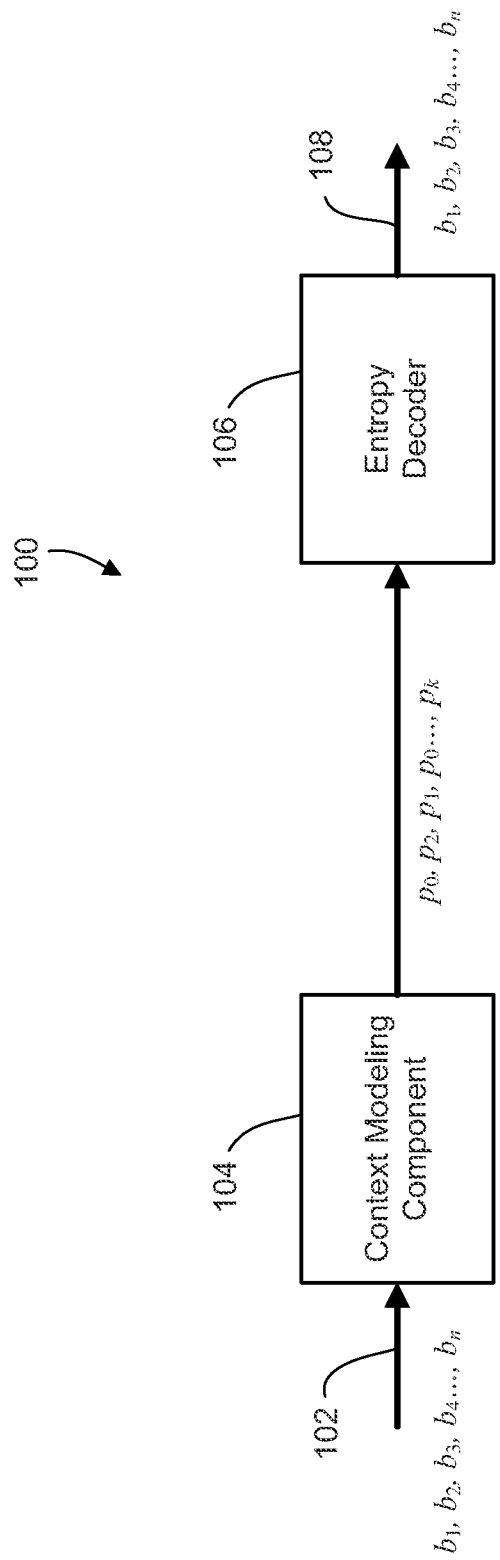
FIG. 1 shows, a block diagram of an decoding process.

In one aspect, the present application describes a method for operating an entropy decoder. In another aspect, the present application describes an entropy decoder.

In an embodiment, a hardware implemented method is provided for operating an entropy decoding engine for use in an entropy decoder operating on data compressed with a context based variable length compression scheme. The entropy decoder receiving code words and probability information, the entropy decoding engine for decoding the code words into phrase words using N search tree lookup tables, each search tree lookup table corresponding to a probability from a set of N probabilities. The method may comprise: the decoding engine receiving a code word and associated probability information; in an initial clock cycle, a branch node block of the decoding engine reading the code word and processing the code word using a lookup table corresponding to the probability information to obtain leaf node information, the branch node block making the probability information and the leaf node information available to a leaf node block of the decoding engine for a next clock cycle; in subsequent clock cycles, repeated until all code words are processed, the decoding engine executing the branch node block and the leaf block simultaneously by, in each clock cycle: the branch node block receiving a subsequent code word and subsequent probability information; the branch node block reading the subsequent code word and processing the subsequent code word using a subsequent lookup table corresponding to the subsequent probability information to obtain subsequent leaf node information, the branch node block making the subsequent probability information and the subsequent leaf node information available to the leaf node block for the next clock cycle; the leaf node block, looking up leaf node contents from the lookup table corresponding to the probability information and the leaf node information provided by the branch node block from a preceding clock cycle to locate the leaf node and outputting leaf node contents from the leaf node and an indication of the probability information, whereby the leaf node contents output by the leaf node block may be assembled to produce the phrase words.

In an aspect, the leaf node contents may be output to an output buffer associated with the tree selection to provide the indication of the probability information.

In an aspect, the indication of the probability information may comprise lookup table selection information associated with the leaf node contents.

In an aspect, the probability information may comprise an indication of associated probability.

In an aspect, the lookup table for each probability may be divided into a branch node lookup table containing branch nodes and a leaf node lookup table containing leaf nodes, the branch node block operable to access the branch node lookup table when processing the code words and the leaf node block operable to access the leaf node lookup table when processing leaf node information.

In an aspect, the branch node block may receive the code words from an input buffer and wherein when the branch node block processes each code word in a current clock cycle, the branch node block further obtains a code word size number of bits, and wherein after obtaining the leaf node information, the branch node block shifting bits of the input buffer the code word size number of bits to replace the code word of the current clock cycle with a next code word.

In an aspect, a computing device may be for executing the method described above.

In an embodiment, an entropy decoding engine may be provided for use in an entropy decoder for operating on data compressed with a context based variable length compression scheme. The entropy decoder may be operable to receive code words and probability information, the code words for decoding into phrase words using N search tree lookup tables, each search tree lookup table corresponding to a probability from a set of N probabilities identified by the probability information. The decoding engine may comprise: an input buffer, a branch node block and a leaf node block; the input buffer in communication with the branch node block and operable to receive the code words and the probability information; the branch node block in operative communication with branch nodes for each of the N lookup tables and the leaf node block; the branch node block comprising branch node control logic operable to: process the code word in the input buffer using the branch nodes from a selected lookup table corresponding to the probability information to obtain leaf node information, and make the leaf node information and the probability information available to the leaf node block; the leaf node block in operative communication with leaf nodes for each of the N lookup tables; the leaf node block comprising leaf node control logic operable to: process the leaf node information and the probability information made available by the branch node block using the leaf nodes from the selected lookup table to obtain leaf node contents.

In an aspect, the branch node block may be operative to process the code word in one clock cycle and to make the leaf node information and the probability information available to the leaf node block for processing in a next clock cycle.

In an aspect, the leaf node block may be further operable to make an indication of the probability information available with the leaf node contents.

In an aspect, the leaf node block may be in communication with a plurality of output buffers each associated with one of the N probabilities, and wherein the leaf node block may be operable to transfer the leaf node contents to the output buffer associated with its corresponding probability information to provide the indication of the probability information.

In an aspect, the lookup table for each probability is divided into a branch node lookup table containing branch nodes and a leaf node lookup table containing leaf nodes, the branch node lookup tables in operative communication with the branch node block and the leaf node lookup tables in operative communication with the leaf node block.

In an aspect, a computing device may be provided comprising the entropy decoding engine described above.

The entropy decoder described within is intended for use decompressing data that has been compressed using a context based variable length coding scheme such as the Context Adaptive Variable Length Coding (CAVLC) process described in the H.264 standard, or other similar coding processes. For instance, the entropy decoder could be used with the PARALLEL ENTROPY CODING AND DECODING METHODS AND DEVICES described in U.S. patent application Ser. No. 12/707,797 or the APPARATUS FOR PARALLEL ENTROPY ENCODING AND DECODING described in U.S. patent application Ser. No. 13/092,735 claiming priority from U.S. Provisional Patent Application No. 61/343,116 (both incorporated herein by reference), and may be conveniently referred to as a Context-Based Adaptive Variable-length to Variable-length code (CAV2V) algorithm.

While examples are provided in this description with reference to the above CAVLC and CAV2V algorithms, it will be understood by the person of skill in the art that this is only an embodiment, and the entropy encoder described herein may be more generally applied.

One of the techniques used in some entropy coding schemes, such as CAVLC, used in H.264/AVC, and CAV2V, is context modeling. With context modeling, each bit of the input sequence has a context, where the context is given by the bits that preceded it. In a first-order context model, the context may depend entirely upon the previous bit (symbol). In many cases, the context models may be adaptive, such that the probabilities associated with symbols for a given context may change as further bits of the sequence are processed.

Reference is made to FIG. 1, which shows a block diagram of an embodiment of a decoding process 100. The decoding process 100 includes a context modeling component 104 and an entropy decoder 106. The context modeling component 104 receives an input sequence x 102, which in this example is an output bit sequence $(b_0, b_1, \ldots, b_n)$ from the entropy decoder 106. The context modeling component 104 determines a context for each bit $b_i$ based on one or more previous bits in the sequence, and determines, based on the adaptive context model and the determined context, a probability $p_i$ associated with that bit $b_i$, where the probability is the probability that the bit will be the Least Probable Symbol (LPS). The LPS may be "0" or "1" in a binary embodiment, depending on the convention or application. The context modeling component outputs the probabilities $(p_0, p_2, p_1, p_2, \ldots, p_k)$. to the entropy decoder 106 for use in decoding a next code word using the probability information. For example, the entropy decoder 106 may be a binary arithmetic coder. The entropy decoder 106 outputs a bitstream 108 of decoded data.

In an alternate decoding process, not shown, the probability information may be included in the encoded bitstream by the entropy encoder that encoded the data. In the alternate embodiment, the entropy decoder 106 receives the encoded bitstream along with the probability information, for instance as header information, directly without processing by the context modeling component 104. The alternate decoding process requires that the initial encoding process be operative to include the probability information with the encoded bitstream.

It will be appreciated that each bit of the input sequence is processed serially to update the context model, and the probability information is supplied to the entropy decoder 106, which the entropy decoder may use to decode the next code word to create the decoded bitstream 108. In some embodiments the decoder 106 may generate intermediate phrase words comprised of phrase word bits and packed phrase word bits that require additional processing to yield the phrase word. In general, such packed phrase word bits are a more efficient representation of the bits to reduce storage requirements. For instance, a long string of 1's followed by a '1' or a long string of '1's followed by a '0' may be replaced with a value indicating the number of 1's in the string. The numerical value having been extracted from the entropy encoded code word decoded by the entropy decoder 106.

Control logic to convert the numeric value to a string of 1's or 0's may reside either in the decoder 104, or may reside in a downstream processing block with larger memory buffers to accommodate the expanded string. In the embodiment below it is assumed that said control logic is contained in a downstream processing block, such that the decoded bitstream 108 includes both phrase word bits and compressed phrase word bits, but both embodiments are contemplated.

In some embodiments, explicit probability information may not be passed from the context modeling component 104 to the entropy decoder 106; rather, in some instances, the context modeling component 104 may, for each bit, send the entropy decoder 106 an indication of the associated probability such as an index value, flag, control signal or other indicator that reflects the probability estimation made by the context modeling component 104 based on the context model and the current context of the input sequence 102. The indication of the associated probability is indicative of the probability estimation associated with its corresponding bit.

In some embodiments, the probability information may be communicated as side band information, for instance by transferring a bit to an input buffer assigned to the same associated probability as the bit. In such an embodiment the indication of the associated probability comprises transferring a bit to an input buffer assigned to the associated probability.

Figure 2A:
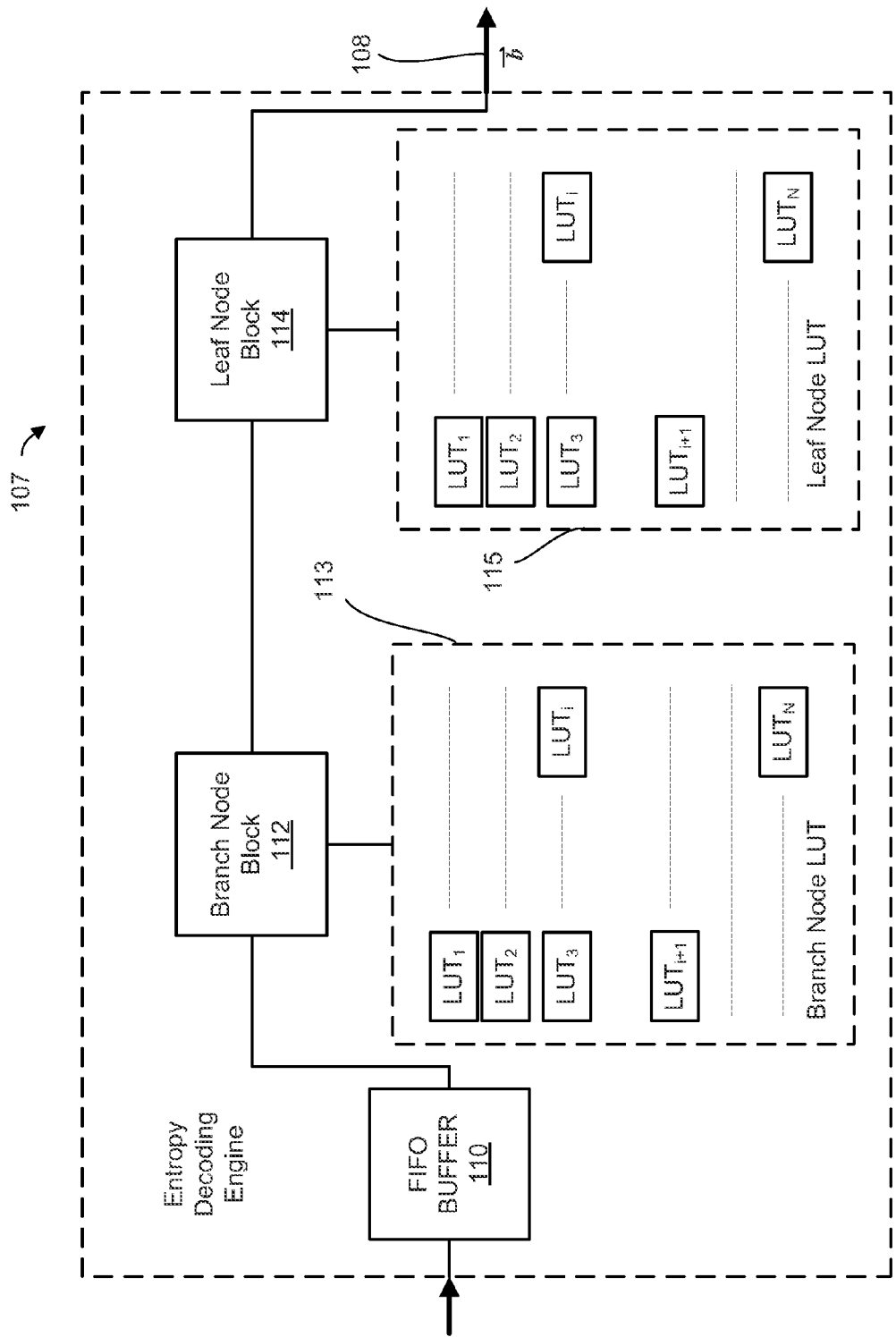
FIG. 2a shows, in block diagram form, an embodiment of an entropy decoder.

In accordance with one aspect, the present application proposes a hardware architecture for a component of an entropy decoder 106, and in particular for an entropy decoding engine 107. Referring to FIG. 2a which shows in block diagram form, an embodiment of a component of an entropy decoder 106, the component comprising an entropy decoding engine 107. In an embodiment, the entropy decoder 106 may be downstream from the context modeling component 104 which, for each bit of the input sequence, determines an estimated probability based on the context model. The context modeling component 104 assigns each bit to one of N probabilities from the context model, each probability having a search tree associated with it. The context modeling component 104 makes the indication of the associated probability available to the entropy decoder 106. The indication of the associated probability comprises a tree selection for a bit of the next code word. In an alternate embodiment, the indication of the associated probability is included in the encoded bitstream by the entropy encoder that encoded the data.

In the embodiment of FIG. 2a, the entropy decoding engine 107 comprising a FIFO buffer 110, a branch node block 112, a leaf node block 113, branch node lookup tables 113 and leaf node look tables 115. The entropy decoding engine 107 may include further components to allow input of the bitstream and output of the decoded bitstream.

The FIFO buffer 110 receives code words to be decoded. The FIFO buffer 110 is in communication with a branch node block 112. Each code word is held in the FIFO buffer 110 until the branch node block 112 is available to process that code word. In the embodiment of FIG. 2a, the branch node block 112 may receive both a code word and an indication of associated probability for that code from the FIFO buffer 110.

Branch node block 112 is in communication with branch node lookup tables (LUTs) 113 and comprises control logic for performing branch node block operations on the code words using the branch node LUTs 113 selected by the indication of associated probability for each code word.

The branch node block 112 is further in operative communication with a leaf node block 114 and provides leaf node information and the probability information, for instance by way of an indication of the associated probability, available to the leaf node block 114 after processing each code word. In an embodiment, the leaf node information may comprise a memory address location of the leaf node contents in the leaf node LUT identified by the associated probability. In an alternate embodiment, the leaf node information may comprise sufficient information for the leaf node block 114 to determine the memory address location of the leaf node contents in the leaf node LUT identified by the associated probability.

While the branch node block 112 may determine the leaf node memory address, in some instances it may be preferred to move the calculation to the leaf node block 114. In such an embodiment, the branch node block 112 provides leaf node information such that the leaf node block 114 may determine the leaf node address. For instance, where the branch node block 112 is performing more operations than the leaf node block 114 such that the branch node block 112 comprises a critical path in the process. In such circumstances the additional time taken by the branch node block 112 to perform a final addition to calculate the leaf node memory address may reduce performance of the entropy decoding engine 107.

The leaf node block 114 is in communication with leaf node lookup tables (LUTs) 115 and comprises control logic for performing leaf node block operations on the leaf node lookup tables (LUTs) 115 using the leaf node information and probability information provided by the branch node block 112. The probability information indicating which search tree lookup table is to be used for the leaf node information.

In an embodiment the leaf node block operations may comprise a leaf node lookup from a selected leaf node LUT using the leaf node information to obtain leaf node contents. In an alternate embodiment, the leaf node block operations may comprise processing of leaf node information to derive a leaf node memory address and performing a leaf node lookup in a selected leaf node LUT using the leaf node memory address to obtain leaf node contents.

The leaf node contents may be communicated to a downstream processing block, for instance as a bitstream 108. Preferably the leaf node block 114 also provides probability information, such as an indication of the associated probability for each leaf node content.

Figure 2B:
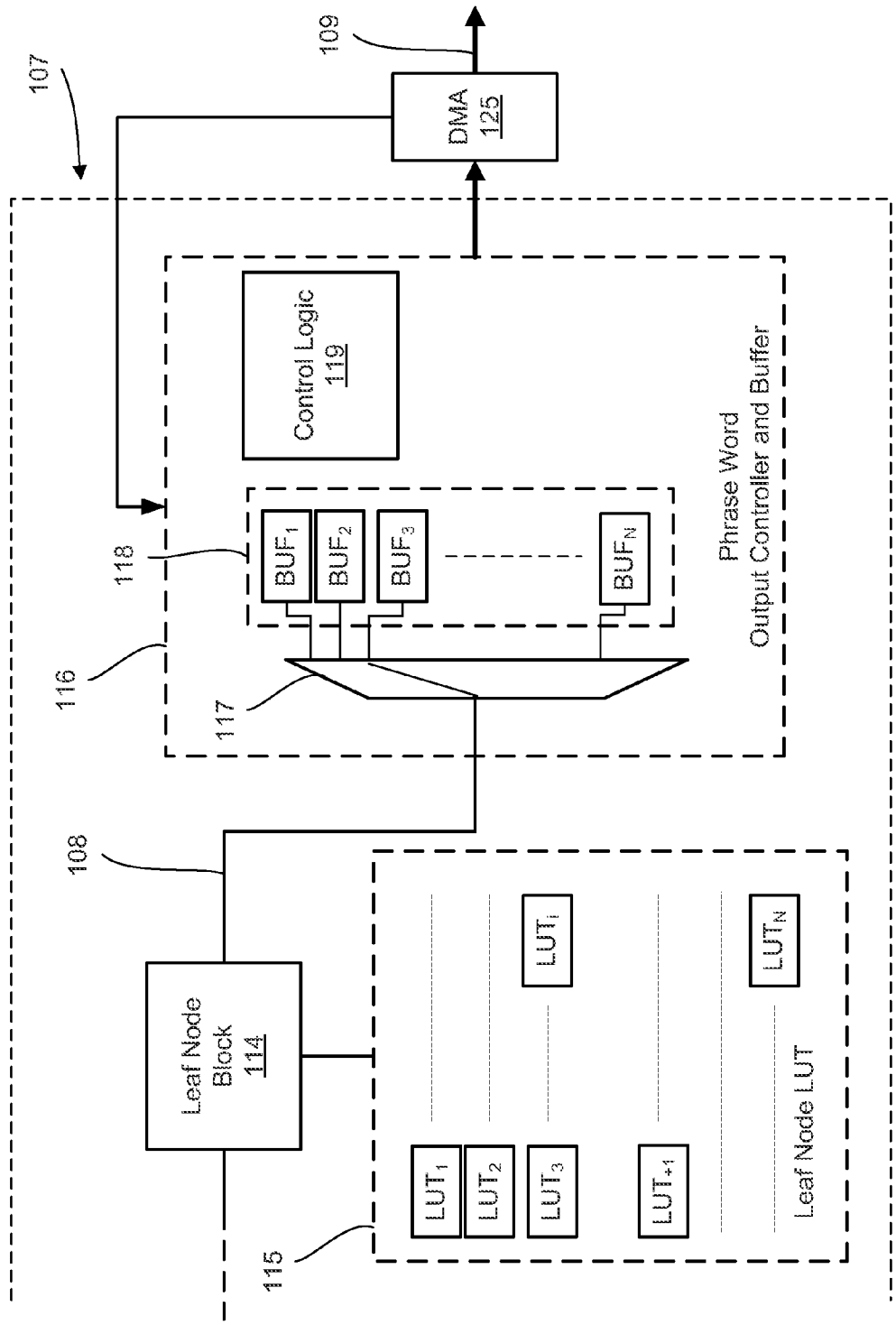

FIG. 2b illustrates an embodiment where a phrase word output controller and buffer 116 is contained within the entropy decoding engine 107. The phrase word output controller and buffer 116 receiving the leaf node contents bitstream 108 and sorting leaf node contents by the associated probability. In the embodiment illustrated, control logic 119 may direct the de-multiplexing element 117 in accordance with the indication provided by the leaf node block 114.

In an embodiment control logic 119 may also be operative to process the leaf node content to produce phrase words. In an alternate embodiment, as illustrated in FIG. 2b, a downstream processing block such as Direct Memory Access Controller ("DMA") 125 is capable of receiving the output leaf node content from the phrase word output controller and buffer 116 for conversion into phrase words.

Figure 3:
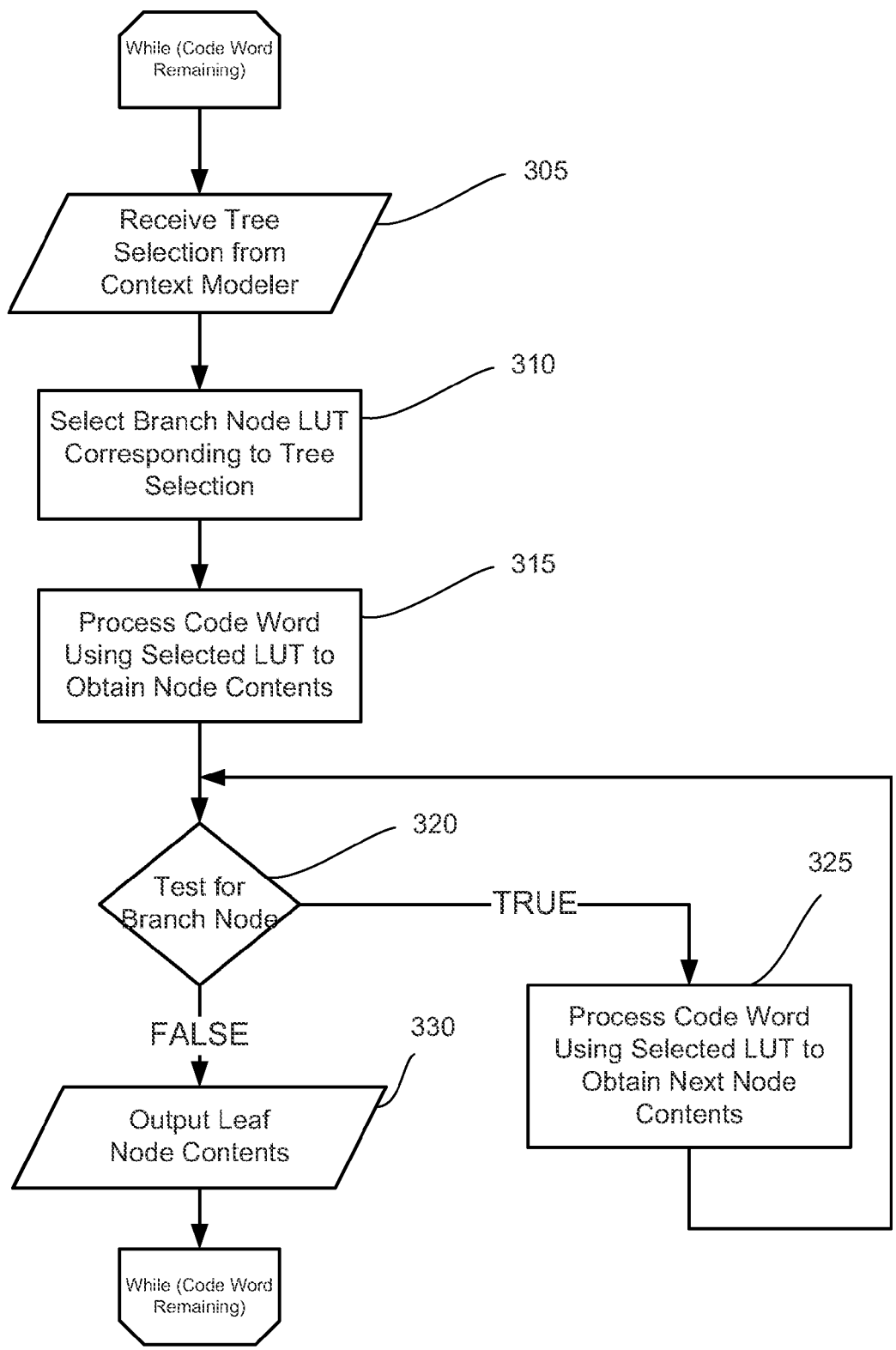
FIG. 3 shows a process flowchart of an algorithm for decoding a code word.

FIG. 3 is a process flowchart in the form of an algorithm that indicates a process for operating on code words using selected lookup tables to output leaf node contents.

In step 305, a tree selection (probability information for that bit of the code word) may be obtained from the context modeling component 104. In step 310 a corresponding Branch Node LUT is identified for the selected tree. In step 315 the code word is processed using the corresponding Branch Node LUT to obtain node contents. The node contents specify a number of bits to be processed. In step 320 the node contents are tested to determine whether the represent a branch node or a leaf node. If the node contents represent a branch node, the code word is further processed in step 325 to obtain the next node contents which is similarly tested in step 320. If the test for branch node in step 320 determines that the node contents are not branch node contents (eg if the node contents are leaf contents), the leaf node contents are output in step 330.

FIGS. 4a, 4b and 4c are process flowcharts illustrating an embodiment for executing the process flowchart of FIG. 3 in hardware.

Referring to FIG. 4a, the process flowchart is illustrated in two process blocks that are labeled: branch node process block 402 and leaf node process block 452.

While the description describes the process flowchart in terms of "steps", it is understood that in hardware the components are set to initiate all processes, typically on a rising clock edge, though some processes must wait for other processes to provide information before their state settles. Thus, while described in terms of steps all processes are completed within one clock cycle, accordingly for practical purposes they are occurring simultaneously.

FIG. 4a illustrates the processes to be executed at clock 0, indicated by clock 480. As described above in reference to FIG. 2a, branch node block 112 receives a code word and probability information. The branch node block 112 processes the code word using the branch node LUT corresponding to the probability information.

In the embodiment of FIGS. 4a, 4b and 4c, the processes of the branch node block 112 and leaf node block 114 are executed in a pipeline architecture such that leaf node block 114 operates on data supplied by branch node block 112 that was processed in a preceding clock cycle. Since the leaf node process block 452 is dependent upon a result of the branch node process block 402, the embodiment of FIGS. 4a, 4b and 4c allows the leaf node process block 452 to operate at the same time as the branch node process block 402 operates to obtain subsequent leaf node information for a subsequent code word. In other words, within a single clock cycle the leaf node process block 452 may immediately start processing leaf node contents, without waiting for a result from the branch node process block.

In an alternate embodiment, the branch node process block 402 and the leaf node process block 452 may be structured to allow processes of both blocks to be processed in a single clock cycle. In the alternate embodiment, the leaf node process block 452 does not start processing at a beginning of the clock cycle, but waits for a result of leaf node information to be output from the branch node process block 402. Thus, the leaf node information and leaf node contents for a code word are obtained within a single clock cycle. The alternate embodiment may be useful, for instance, where the trees have a relatively low number of branches, and calculations are simple enough, that a combination of the processes of the branch node process block and the leaf node process block do not unduly slow down a board clock speed of the entropy decoding engine 107.

A determination whether to implement the pipelined architecture or the alternate embodiment may be made during design of the hardware, based upon characteristics of the trees and calculations required for a particular context modeling component and entropy decoder. The present application assumes that exemplar tree characteristics and calculations are sufficiently complex to require the pipelined architecture in the embodiments that follow, though both embodiments are contemplated.

FIG. 4a illustrates an initial clock cycle as indicated by the clock 480 at clock 0.

Branch Node Process Block 402 starts at step 404 by receiving a clock 0 tree selection in the form of probability information which the branch node block 112 makes available to the leaf node block 114 for the next clock cycle. The branch node block 112 may make the probability information available, for instance, by outputting an identifier to a buffer accessible to the leaf node process block 452 in the next clock cycle, or by outputting a result of its process from the clock 0 cycle to a buffer accessible to the leaf node process block 452 that is associated with the probability.

In step 406, a clock 0 branch node LUT is selected, corresponding to the clock 0 tree selection.

In step 408, the branch node block 112 processes the code word by performing multiple branch node table lookups in series within the clock cycle 0, each branch node table lookup specifying a number of bits to be processed, to identify the leaf node. The code word size for the code word being processed may be determined by summing a total number of bits processed after performing the multiple branch node table lookups. The branch node block 112 makes clock 0 leaf node information available to the leaf node block 114.

The branch node block 112 also evaluates the code word size based on the number of bits required to identify the leaf node to determine the number of bits in the code word. The branch node block 112 may then shift out a code word size number of bits from the input buffer 110 to trigger replacement code word bits to replace the code word bits processed by the branch node block 112.

The leaf node block 114 is idle during clock 0.

Referring to FIG. 4b, the branch node block 112 repeats the steps from clock cycle 0, now using bits from the replenished input buffer 110 and a clock 1 tree selection supplied by the context modeling component 104 in step 414. Steps 416 and 418 similarly proceed using the updated information for clock cycle 1.

In step 420, the leaf node block 114 receives the clock 0 tree selection, in the form of probability information, and the clock 0 leaf node information that was made available by the branch node block 112.

In step 422, the leaf node block 114 selects a clock 1 leaf node LUT corresponding to the clock 0 tree selection.

In step 424, the leaf node block 114 obtains clock 1 leaf node contents.

In step 426, the leaf node block 114 makes the clock 1 leaf node contents available for downstream processing as indicated in FIGS. 2a and 2b. Preferably, the leaf node block 114 may further provide the probability information associated with the leaf node contents.

FIG. 4c is the same process flowchart as FIG. 4b, generalized to clock cycle i. Typically, the decoder 106 will operate on a stream of code words until there are no more code words to be processed. The first code word in the stream of code words will be processed for leaf node information while the leaf node block is idle and the last code word will be processed for leaf node contents while the branch node block is idle. For all remaining code words in the stream of code words, in each clock cycle the leaf node block will be processing leaf node information obtained in a previous clock cycle at the same time the branch node block is processing a subsequent code word in the stream.

Figure 5A:
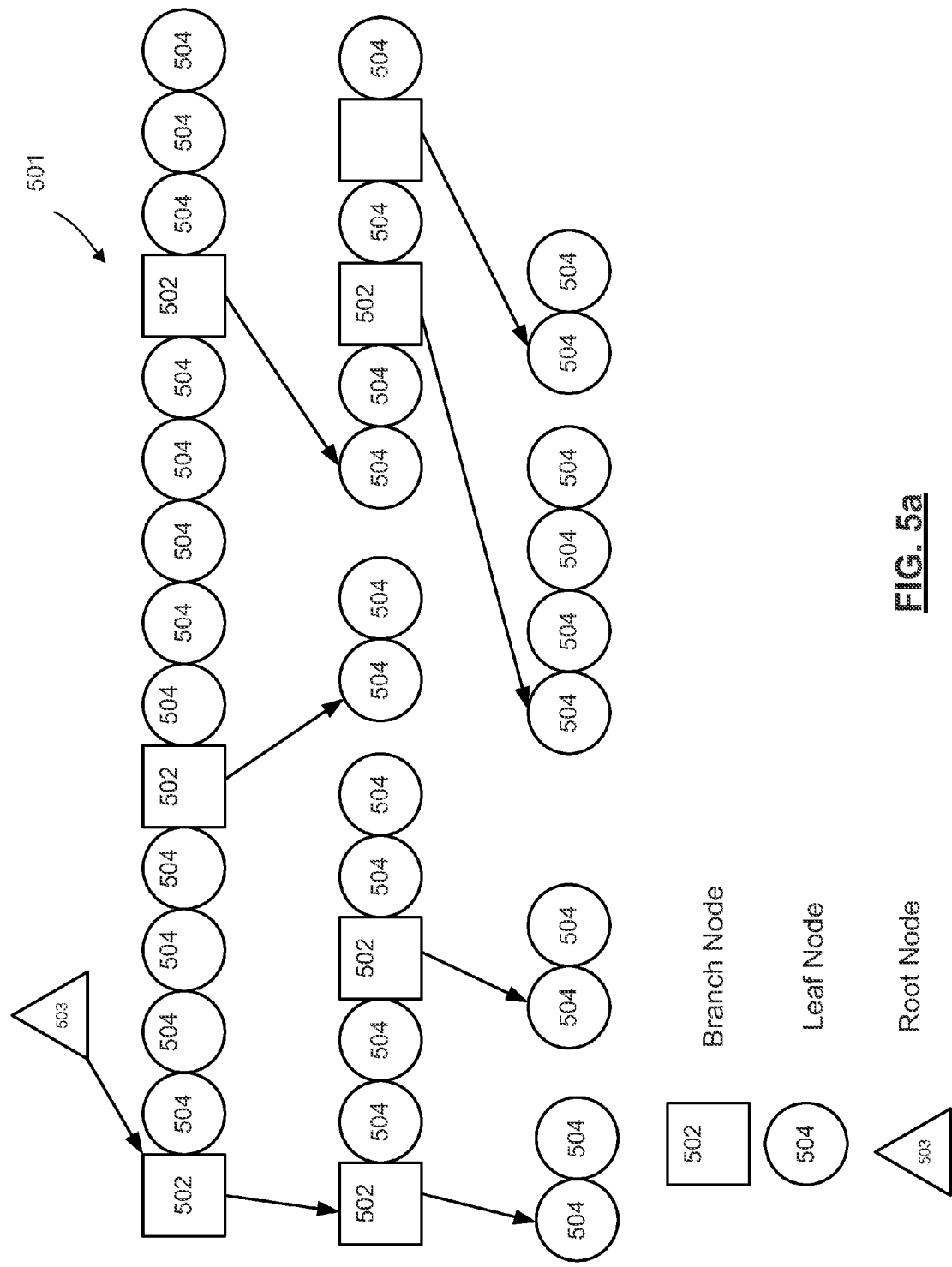
FIG. 5a shows an embodiment of a lookup table used in an entropy encoder.

FIG. 5a is a block diagram conceptual illustration of the selected tree look-up process. FIG. 5a illustrates an exemplar search tree look-up table for one probability that includes branch nodes 502 and leaf nodes 504. Branch nodes 502 are nodes that point to nodes in the next level of the tree 501. Leaf nodes 504 are nodes that contain content being searched for in the tree 501. Root node 503 is the starting point to begin searching the tree.

A number of branch nodes 502 required to be traversed before arriving at a leaf node 504 varies depending upon a starting point, as well as the characteristics of the tree being searched. The characteristics of the tree are in part related to characteristics of the context modeling algorithm being used including the number of probabilities being used.

Figure 5B:
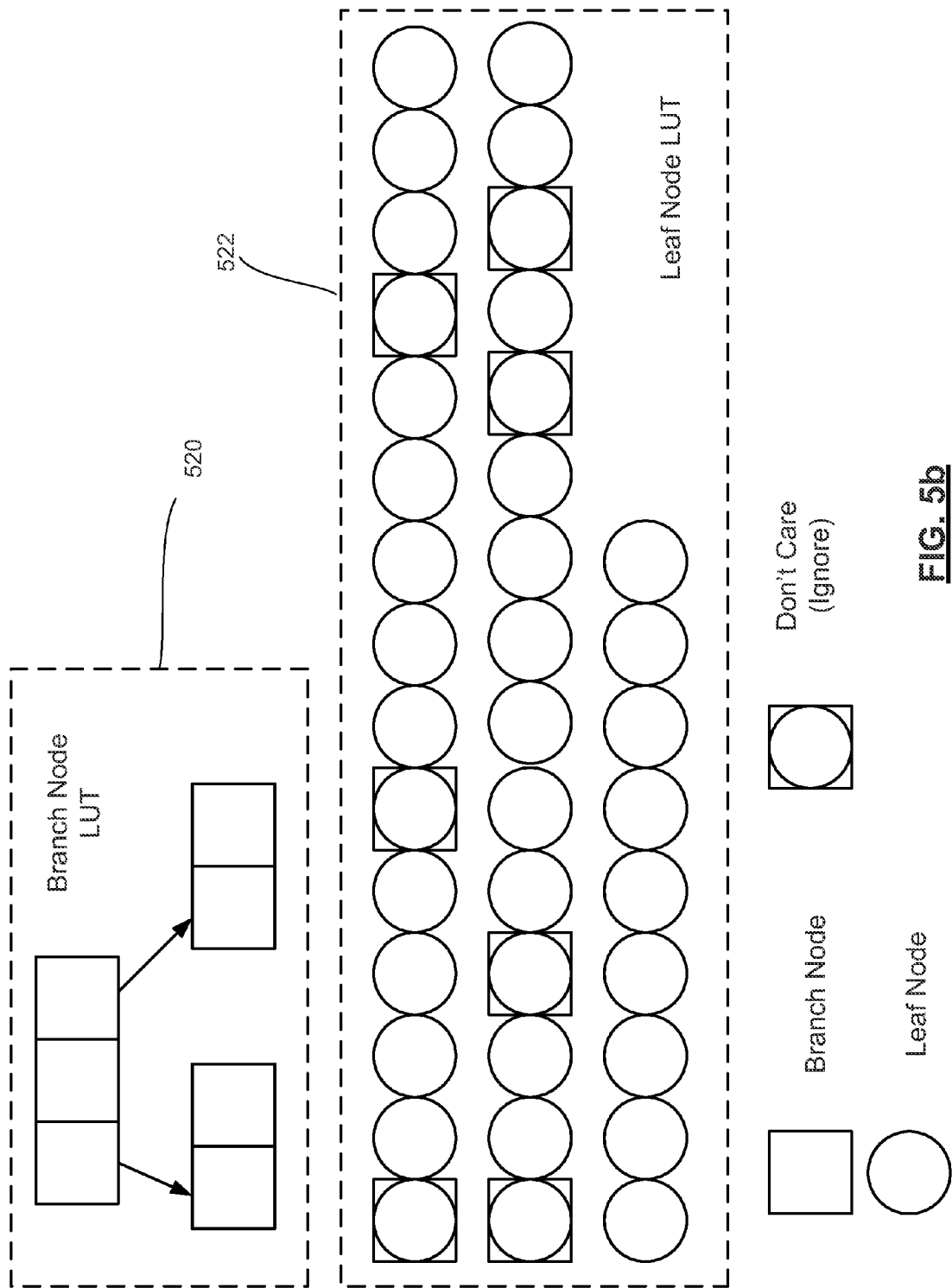
FIG. 5b shows the lookup table of FIG. 5a re-organized according to an embodiment.

FIG. 5b is a block diagram illustration of an embodiment for implementing the selected tree look-up process. As illustrated in FIG. 5b, the search tree lookup table 501 has been divided into a branch node LUT 520 and a leaf node LUT 522. The branch node LUT 520 and the leaf node LUT 522 are simplified representations corresponding to the Branch Node LUT 113 and the Leaf Node LUT 115 from FIG. 2a.

The branch node LUT 520 may be in operative communication with the branch node block 112 and the leaf node LUT 522 may be in operative communication with the leaf node block 114. Separating the branch nodes from the tree provides the branch node block 112 with smaller branch node LUTs which may be advantageous from both a cost and performance perspective.

The embodiment of FIG. 5b includes some branch nodes marked as "don't care". This is an indication that these memory addresses were set to be ignored. Marking an address to be ignored has the effect of logically removing it from the calculations, though the address still takes up physical space in silicon.

Figure 5C:
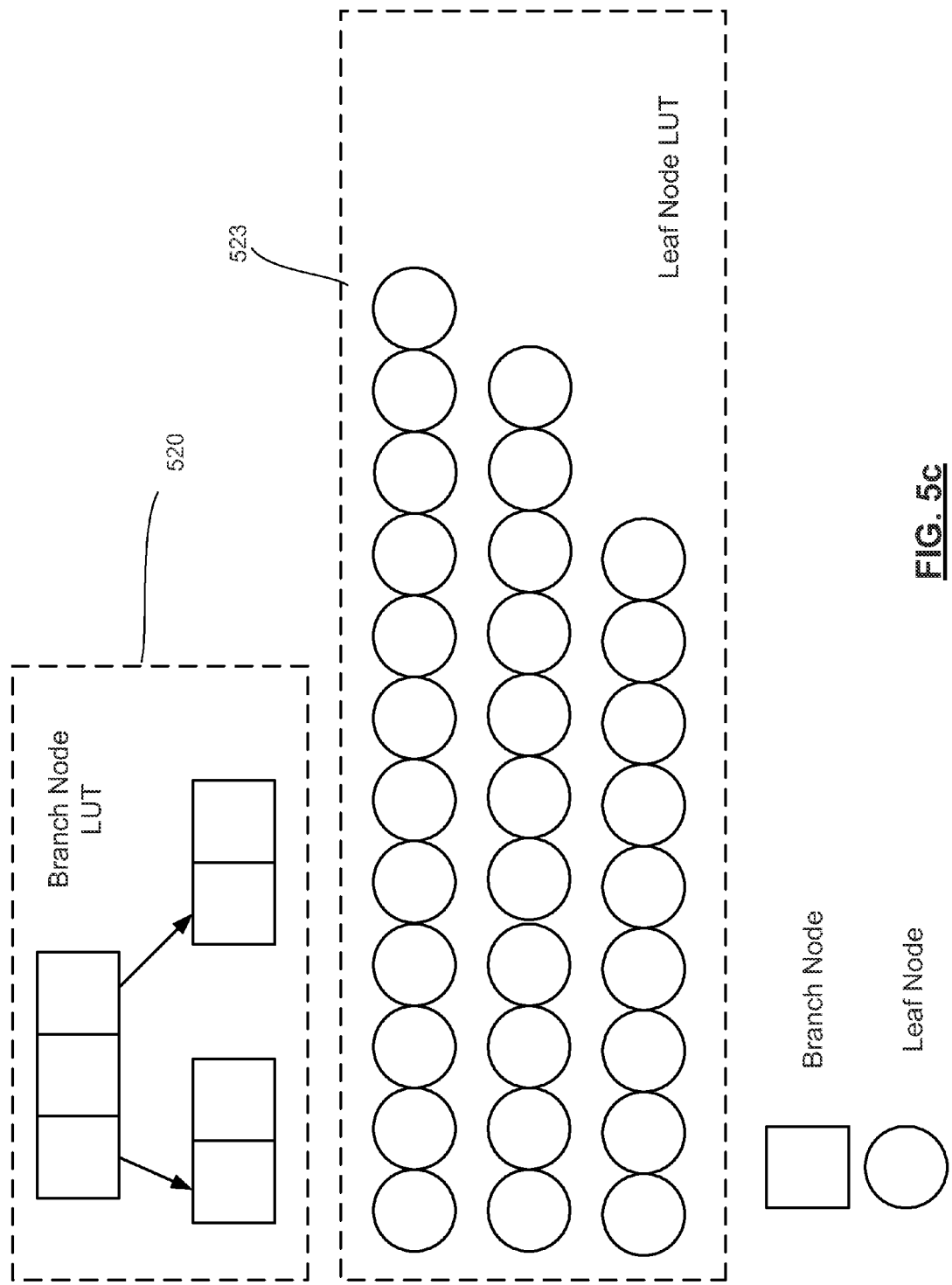
FIG. 5c is an alternative embodiment of FIG. 5b.
Figure 6:
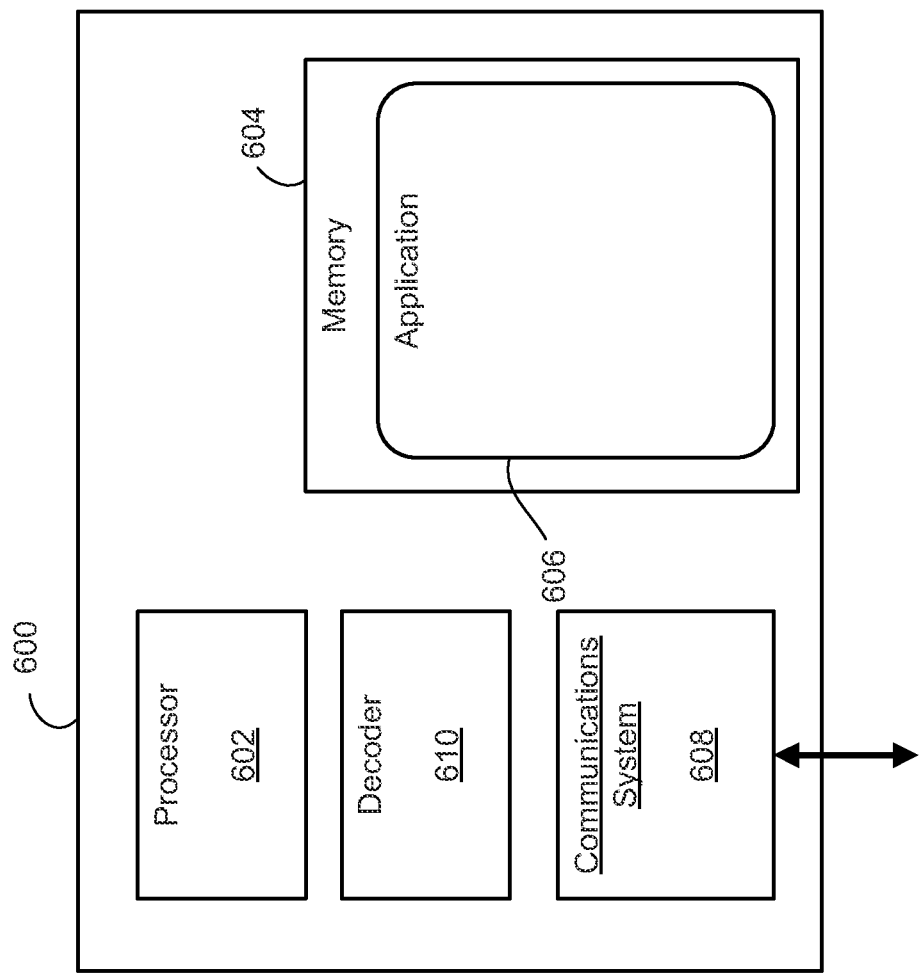
FIG. 6 shows, in block diagram form, a computing device including a decoder.

FIG. 5c is an alternate embodiment illustrating the leaf node LUT 523 with the branch nodes removed from the leaf node LUT 523. FIG. 6 is an embodiment of a computing device 600 including a decoder 610. The computing device 600 further includes a processor 602 and memory 604, for execution of program code on the device 600 as well as management of the encoder 610, and optionally a communications system 608. In an embodiment device 600 may further comprise an input interface such as an RCA jack, microphone or digital input, such as a digital camera, for inputting data content to be encoded and an output interface such as a screen, speaker or headphone jack for outputting decoded content to a user of the device 600. In the embodiment illustrated an application 6906 is resident in the memory 604, for instance for controlling the encoder 610 or for displaying audio or video content decoded by the decoder 610.

Accordingly in an embodiment such as FIG. 6, a computing device may be provided for downloading compressed audio visual content through the communication system 608.

Certain adaptations and modifications of the described embodiments can be made. Therefore, the above discussed embodiments are considered to be illustrative and not restrictive.

What is claimed is:

1. A hardware implemented method of operating an entropy decoding engine for use in an entropy decoder operating on data compressed with a context based variable length compression scheme, the entropy decoder receiving code words and probability information, the entropy decoding engine for decoding the code words into phrase words using N search tree lookup tables, each search tree lookup table corresponding to a probability from a set of N probabilities, the method comprising:

the decoding engine receiving a code word and associated probability information;

a branch node block of the decoding engine reading the code word and processing the code word using a lookup table corresponding to the probability information to obtain leaf node information, the branch node block making the probability information and the leaf node information available to a leaf node block of the decoding engine;

the leaf node block, looking up leaf node contents from the lookup table corresponding to the probability information and the leaf node information provided by the branch node block to locate the leaf node and outputting leaf node contents from the leaf node and an indication of the probability information, whereby the leaf node contents output by the leaf node block may be assembled to produce the phrase words.

2. The method of claim 1 wherein the leaf node information comprises a memory address location of the leaf node contents in the leaf node.

3. The method of claim 1 wherein the branch node block makes the probability information and the leaf node information available to the leaf node block in an initial clock cycle, and the leaf node block outputs the corresponding leaf node contents in a subsequent clock cycle.

4. The method of claim 3 wherein the leaf node block further outputs prior leaf node contents in the initial clock cycle based upon prior probability information and prior leaf node information provided by the branch node block in a prior clock cycle.

5. The method of claim 1 wherein the leaf node block locates the leaf node and obtains the leaf node contents by performing a leaf node lookup from a selected leaf node look up table corresponding to the leaf node information.

6. The method of claim 1 wherein the leaf node block receives the leaf node information and determines a memory address location of the leaf node contents in the leaf node.

7. The method of claim 6 wherein the leaf node block locates the leaf node and obtains the leaf node contents by performing a leaf node lookup from a selected leaf node look up table corresponding to the memory address location.

8. The method of claim 1 wherein the leaf node block waits for the branch node block to provide the probability information and the leaf node information before looking up the leaf node contents.

9. A computing device including an entropy decoder and entropy decoding engine for executing the method of claim 1.

10. An entropy decoding engine for use in an entropy decoder for operating on data compressed with a context based variable length compression scheme, the entropy decoder operable to receive code words and probability information, the code words for decoding into phrase words, the decoding engine comprising:

a branch node block operable to receive a code word and corresponding probability information, and, for an initial clock cycle, process the code word to obtain leaf node information, and to make the leaf node information and the probability information available to a leaf node block; and, the leaf node block operative to process the leaf node information and the probability information made available by the branch node block in a subsequent clock cycle to obtain leaf node contents.

11. The entropy decoding engine of claim 10 wherein the leaf node block is further operative to output the leaf node contents.

12. The entropy decoding engine of claim 10 wherein the leaf node block is further operative in the initial clock cycle to process prior leaf node information and prior probability information made available by the branch node block in a prior clock cycle to obtain prior leaf node contents.

13. The entropy decoding engine of claim 11 wherein the leaf node block is further operable to output an indication of the probability information.

14. A computing device comprising the entropy decoding engine of claim 10.

* * * * *